US008530920B2

(12) United States Patent
Tsai

(10) Patent No.: US 8,530,920 B2
(45) Date of Patent: Sep. 10, 2013

(54) PACKAGING STRUCTURE FOR PLURAL BARE CHIPS

(75) Inventor: Chong-Han Tsai, Kaohsiung (TW)

(73) Assignee: Sunonwealth Electric Machine Industry Co., Ltd., Kaohsiung (TW)

( * ) Notice: Subject to any disclaimer, the term of this patent is extended or adjusted under 35 U.S.C. 154(b) by 63 days.

(21) Appl. No.: 13/085,572

(22) Filed: Apr. 13, 2011

(65) Prior Publication Data

US 2012/0224366 A1 Sep. 6, 2012

(30) Foreign Application Priority Data

Mar. 2, 2011 (TW) .............................. 100106938 A

(51) Int. Cl.
*H01L 33/00* (2010.01)

(52) U.S. Cl.
USPC ........ 257/98; 257/99; 257/100; 257/E33.066; 257/E21.506; 438/27

(58) Field of Classification Search
USPC .................... 257/98–100, E33.061, E33.066, 257/E21.506
See application file for complete search history.

(56) References Cited

U.S. PATENT DOCUMENTS

| 6,278,145 | B1 * | 8/2001  | Kato .............................. 257/292 |
| 6,881,980 | B1 * | 4/2005  | Ting ................................ 257/81 |
| 7,061,454 | B2 * | 6/2006  | Sasuga et al. .................... 345/82 |
| 7,098,485 | B2 * | 8/2006  | Isokawa ........................... 257/98 |
| 7,256,428 | B2 * | 8/2007  | Braune et al. ................. 257/100 |
| 7,300,183 | B2 * | 11/2007 | Kiyomoto et al. ............ 362/297 |
| 7,339,197 | B2 * | 3/2008  | Lin et al. ........................ 257/95 |
| 7,408,203 | B2 * | 8/2008  | Kim et al. ....................... 257/98 |
| 7,456,452 | B2 * | 11/2008 | Wells et al. .................... 257/292 |
| 7,491,978 | B2 * | 2/2009  | Zakgeym et al. ............... 257/98 |
| 7,595,515 | B2 * | 9/2009  | Thompson et al. ........... 257/103 |
| 7,696,525 | B2   | 4/2010  | Kim et al. |
| 7,709,856 | B2 * | 5/2010  | Tsukagoshi ................... 257/100 |
| 7,800,125 | B2   | 9/2010  | Chen |
| 7,872,279 | B2 * | 1/2011  | Lin et al. ......................... 257/99 |
| RE42,112  | E  * | 2/2011  | Han et al. ........................ 257/99 |
| 7,888,178 | B2 * | 2/2011  | Wada et al. .................... 438/113 |
| 7,923,741 | B1 * | 4/2011  | Zhai et al. ....................... 257/98 |
| 7,924,495 | B1 * | 4/2011  | DiDomenico ................ 359/316 |
| 7,956,375 | B2 * | 6/2011  | Li et al. ........................... 257/98 |
| 7,994,518 | B2 * | 8/2011  | Wang et al. ..................... 257/82 |
| 8,058,669 | B2 * | 11/2011 | Chen et al. ...................... 257/99 |
| 8,105,853 | B2 * | 1/2012  | Xu ................................. 438/27 |
| 8,167,462 | B2 * | 5/2012  | Kim et al. ................. 362/311.02 |
| 8,217,409 | B2 * | 7/2012  | Xu ................................. 257/95 |
| 2002/0025593 | A1 * | 2/2002 | Matsuo .......................... 438/31 |
| 2002/0131145 | A1 * | 9/2002 | Lin et al. ...................... 359/248 |
| 2002/0171911 | A1 * | 11/2002 | Maegawa ...................... 359/308 |

(Continued)

*Primary Examiner* — N Drew Richards
*Assistant Examiner* — Ankush Singal
(74) *Attorney, Agent, or Firm* — Alan Kamrath; Kamrath IP Lawfirm, P.A.

(57) ABSTRACT

A packaging structure for plural bare chips includes a substrate, a plurality of bare light-emitting chips, and a transparent light guide. The substrate has a supporting surface. The bare light-emitting chips are disposed on the supporting surface of the substrate. The transparent light guide covers and seals up the bare light-emitting chips, with a side of the transparent light guide facing away from the supporting surface forming a light-outputting layer with a light gathering member. Alternatively, a reflective layer can be arranged on the supporting surface and covered by the transparent light guide. Accordingly, a packaging structure for plural bare chips with high illuminous efficiency, high heat-dissipating efficiency, and low cost of manufacture is provided.

19 Claims, 7 Drawing Sheets

(56) References Cited

U.S. PATENT DOCUMENTS

| | | | |
|---|---|---|---|
| 2003/0219207 A1* | 11/2003 | Guy | 385/49 |
| 2004/0173808 A1* | 9/2004 | Wu | 257/99 |
| 2005/0007793 A1* | 1/2005 | Yoshida et al. | 362/558 |
| 2005/0033119 A1* | 2/2005 | Okawa et al. | 600/249 |
| 2005/0185419 A1* | 8/2005 | Holman et al. | 362/561 |
| 2005/0274967 A1* | 12/2005 | Martin et al. | 257/98 |
| 2006/0027828 A1* | 2/2006 | Kikuchi | 257/99 |
| 2006/0054904 A1* | 3/2006 | Lin et al. | 257/88 |
| 2006/0054913 A1* | 3/2006 | Hadame et al. | 257/99 |
| 2006/0138443 A1* | 6/2006 | Fan et al. | 257/100 |
| 2006/0180824 A1* | 8/2006 | Kim et al. | 257/99 |
| 2006/0284205 A1* | 12/2006 | Liu | 257/98 |
| 2007/0001187 A1* | 1/2007 | Kim | 257/98 |
| 2007/0019412 A1* | 1/2007 | Han et al. | 362/247 |
| 2007/0035968 A1* | 2/2007 | Nakano | 362/612 |
| 2007/0114555 A1* | 5/2007 | Takemoto et al. | 257/99 |
| 2007/0145383 A1* | 6/2007 | Rho et al. | 257/79 |
| 2007/0160369 A1* | 7/2007 | Jane | 396/529 |
| 2007/0195534 A1* | 8/2007 | Ha et al. | 362/327 |
| 2007/0212802 A1* | 9/2007 | Lee et al. | 438/22 |
| 2008/0111149 A1* | 5/2008 | Shen | 257/98 |
| 2008/0142822 A1* | 6/2008 | Kim et al. | 257/98 |
| 2008/0210968 A1* | 9/2008 | Ishihara | 257/98 |
| 2008/0224160 A1* | 9/2008 | Chang et al. | 257/98 |
| 2008/0246397 A1* | 10/2008 | Wang et al. | 313/512 |
| 2009/0140271 A1* | 6/2009 | Sah | 257/88 |
| 2009/0141516 A1* | 6/2009 | Wu et al. | 362/609 |
| 2009/0146155 A1* | 6/2009 | Wang et al. | 257/82 |
| 2009/0152582 A1* | 6/2009 | Chang et al. | 257/98 |
| 2009/0273735 A1* | 11/2009 | Yeh | 349/67 |
| 2009/0283784 A1* | 11/2009 | Chang | 257/98 |
| 2009/0315057 A1* | 12/2009 | Konishi et al. | 257/98 |
| 2010/0061106 A1* | 3/2010 | Shyu et al. | 362/311.02 |
| 2010/0097803 A1* | 4/2010 | Wu et al. | 362/244 |
| 2010/0166407 A1* | 7/2010 | Iwanaga et al. | 396/176 |
| 2010/0277667 A1* | 11/2010 | Chang | 349/62 |
| 2010/0290208 A1* | 11/2010 | Pickard | 362/84 |
| 2011/0114979 A1* | 5/2011 | Jang | 257/98 |
| 2011/0133220 A1* | 6/2011 | Kim et al. | 257/88 |
| 2011/0140148 A1* | 6/2011 | Liu | 257/98 |
| 2011/0241028 A1* | 10/2011 | Park et al. | 257/88 |
| 2011/0254039 A1* | 10/2011 | Kim et al. | 257/98 |
| 2011/0266566 A1* | 11/2011 | Chung | 257/91 |
| 2011/0278636 A1* | 11/2011 | Seo et al. | 257/99 |
| 2012/0037942 A1* | 2/2012 | Sanga | 257/98 |
| 2012/0261690 A1* | 10/2012 | Lee et al. | 257/98 |
| 2012/0267661 A1* | 10/2012 | Kim et al. | 257/98 |
| 2012/0299018 A1* | 11/2012 | Chen et al. | 257/88 |

* cited by examiner

PACKAGING STRUCTURE FOR PLURAL BARE CHIPS

BACKGROUND OF THE INVENTION

1. Field of the Invention

The present invention relates to a packaging structure for plural bare light-emitting chips and, more particularly, to a packaging structure that achieves high illuminous efficiency as well as low manufacture cost.

2. Description of the Related Art

Referring to FIG. 1, a cross-sectional view of a conventional LED packaging structure is shown. The LED packaging structure has a substrate 91, a plurality of bare LED chips 92, and a light guide 93. The substrate 91 supports the bare LED chips 92 and light guide 93, and may have circuits connecting with and for operating the bare LED chips 92. Each bare LED chip 92 may receive electrical power and then emit light, which has a light-emitting face 921 facing away from the substrate 91 and able to emit the light. The light guide 93 is made of transparent material, covers and seals up the bare LED chips 92, and connects with the substrate 91. Particularly, a side of the light guide 93 facing away from the substrate 91 forms a semi-spherical surface 931 to gather the light emitted by the light-emitting faces 921 of the bare LED chips 92 to enhance the illuminous efficiency in a predetermined direction.

However, the above conventional LED packaging structure has the following drawbacks. First, when the bare LED chips 92 are operated, a thickness of the light guide 93 between the semi-spherical surface 931 and the light-emitting faces 921 results in low dissipation efficiency of heat generated by the operated bare LED chips 92. Accumulation of heat will seriously affect the efficiency of light emission of the bare LED chips 92 after a continuous operation of the bare LED chips 92, which can even damage the bare LED chips 92. Second, the light guide 93 has to be made by transparent material not easy to deteriorate by heat, which is expensive, so as to suffer the heat of the operated bare LED chips 92 without deterioration, and thus reducing the volume of the light guide 93 is an efficient way to lower the cost of manufacture. However, in order to maintain a sufficient illuminous efficiency, the thickness of the light guide 93 between the semi-spherical surface 931 and the light-emitting faces 921 should be held and thus limits the reduced cost of manufacture. Besides, as the amount of the bare LED chips 92 increases, the diameter of the semi-spherical surface 931 and the volume of the light guide 93 must largely increase to completely cover all the bare LED chips 92 since the total area of the light-emitting faces 921 increases. Therefore, the above said two drawbacks go worse as the amount of the bare LED chips 92 increases.

In light of this, it is desired to improve the conventional LED packaging structure to maintain a preferable illuminous efficiency as well as enhance the heat-dissipating efficiency and lower the manufacture cost.

SUMMARY OF THE INVENTION

It is therefore the primary objective of this invention to provide a packaging structure for plural bare light-emitting chips, which not only maintains a high illuminous efficiency but enhances heat-dissipating efficiency as well as lowers manufacture cost.

The invention discloses a packaging structure for plural bare chips. The packaging structure comprises a substrate, a plurality of bare light-emitting chips, a reflective layer, and a transparent light guide. The substrate has a supporting surface; the plurality of bare light-emitting chips is supported by the supporting surface; the reflective layer is arranged on the supporting surface and adjacent to the bare light-emitting chips; and the transparent light guide covers the bare light-emitting chips and the reflective layer, with the transparent light guide having a light-outputting layer on a side of the transparent light guide facing away from the supporting surface, and with the light-outputting layer having a light gathering member.

The invention discloses another packaging structure for plural bare chips. The packaging structure for plural bare chips comprises a substrate, a reflective layer, a plurality of bare light-emitting chips, and a transparent light guide. The substrate has a supporting surface; the reflective layer is arranged on the supporting surface and has a plurality of through holes; the plurality of bare light-emitting chips is arranged on the reflective layer and corresponds to the through holes; and the transparent light guide covers the bare light-emitting chips and the reflective layer, with the transparent light guide having a light-outputting layer on a side of the transparent light guide facing away from the supporting surface, and with the light-outputting layer having a light gathering member.

Furthermore, the invention also discloses a packaging structure for plural bare chips comprises a substrate, a plurality of bare light-emitting chips, and a transparent light guide. The substrate has a supporting surface; the plurality of bare light-emitting chips is supported by the supporting surface; and the transparent light guide covers the bare light-emitting chips, with the transparent light guide having a light-outputting layer on a side of the transparent light guide facing away from the supporting surface, and with the light-outputting layer having a light gathering member. The light gathering member is in a form of plural ridges, and an included angle of a tip of each ridge is in a range between a first angle and a second angle, with the first angle being twice a sum of a critical angle and 20 degrees, with the second angle being twice a difference of the critical angle and 20 degrees. The critical angle is in the transparent light guide for boundary between the transparent light guide and the air.

BRIEF DESCRIPTION OF THE DRAWINGS

The present invention will become more fully understood from the detailed description given hereinafter and the accompanying drawings which are given by way of illustration only, and thus are not limitative of the present invention, and wherein.

Figure 1:
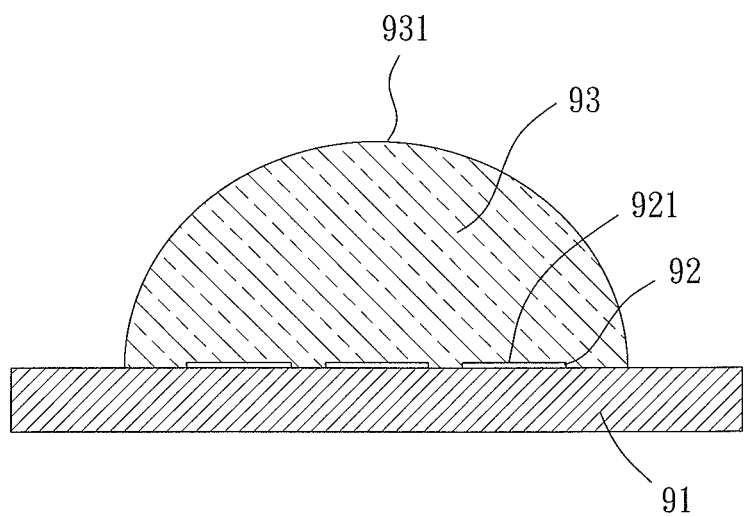
FIG. 1 shows a cross-sectional view of a conventional packaging structure for LED chips.

In the various figures of the drawings, the same numerals designate the same or similar parts. Furthermore, when the term "first", "second", "third", "fourth", "inner", "outer" "top", "bottom" and similar terms are used hereinafter, it should be understood that these terms refer only to the structure shown in the drawings as it would appear to a person viewing the drawings, and are utilized only to facilitate describing the invention.

DETAILED DESCRIPTION OF THE INVENTION

Figure 2:
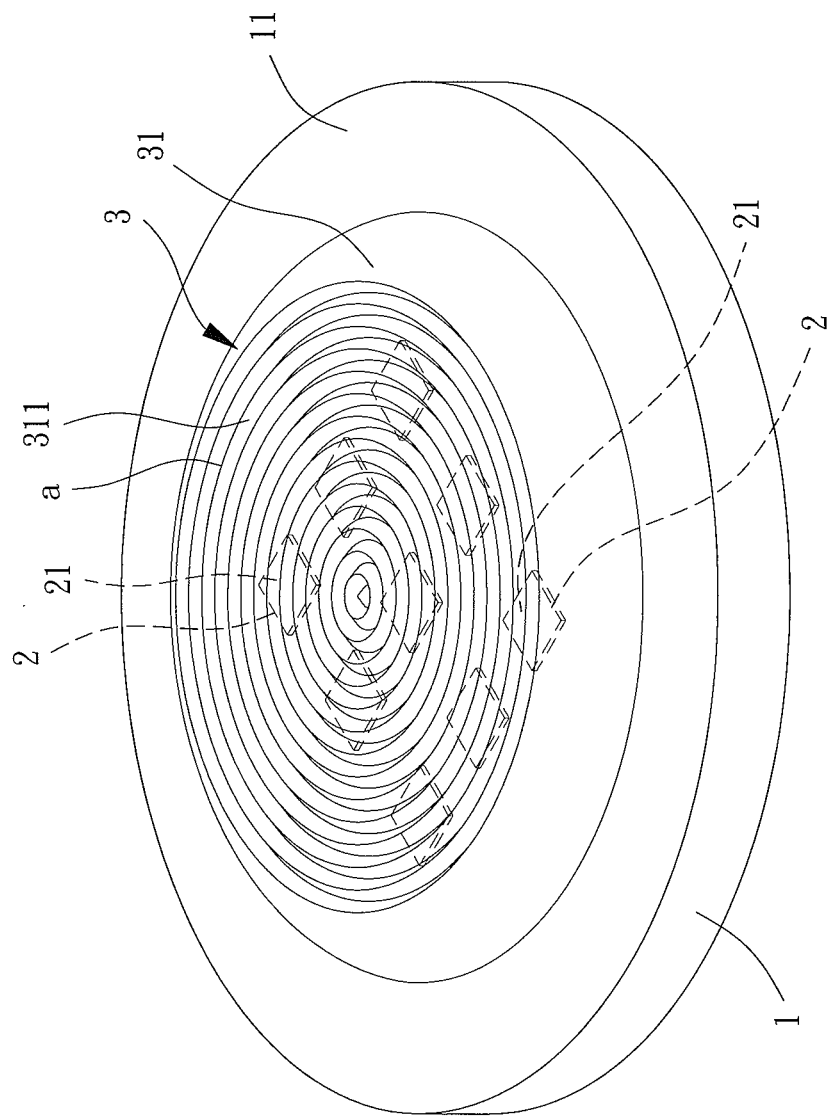
FIG. 2 shows a perspective view of a packaging structure for plural bare chips according to a first embodiment of the invention.
Figure 3:
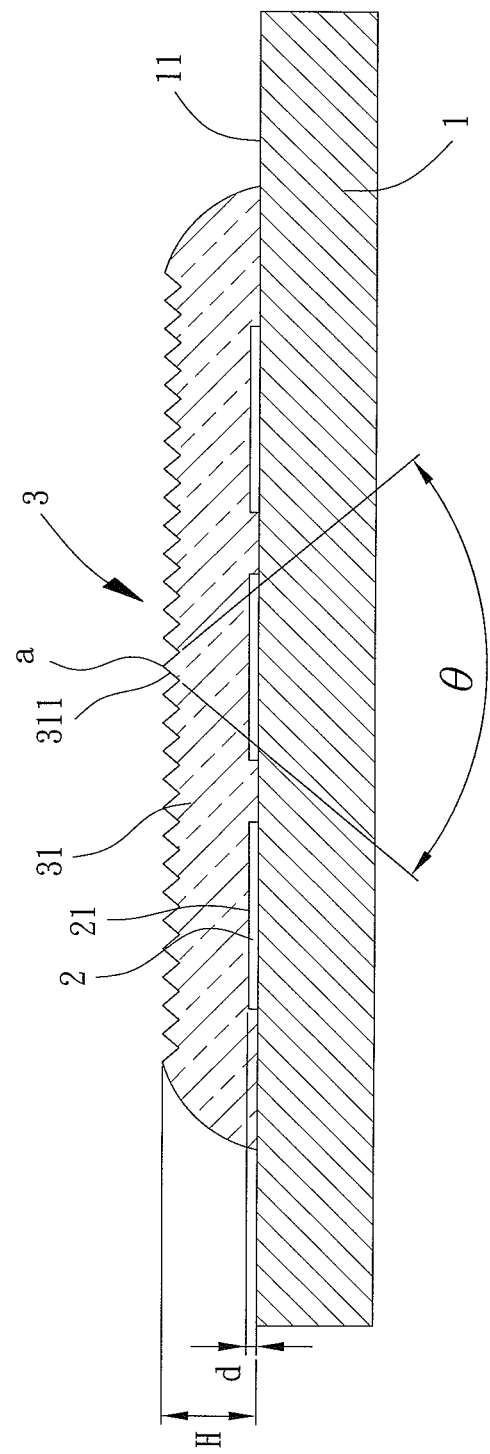
FIG. 3 shows a cross-sectional view of a packaging structure for plural bare chips according to the first embodiment of the invention.

Referring to FIGS. 2 and 3, a first embodiment of a packaging structure for plural bare chips of the present invention is shown. The packaging structure includes a substrate 1, a plurality of bare light-emitting chips 2, and a transparent light guide 3. The substrate 1 supports the bare light-emitting chips 2 and the transparent light guide 3; the bare light-emitting chips 2 receives electrical power and emits light; and the transparent light guide 3 covers and seals up the bare light-emitting chips 2 and couples with the substrate 1.

Please refer to FIGS. 2 and 3 again. The substrate 1 has a supporting surface 11 to support the bare light-emitting chips 2 and the transparent light guide 3, while the circuit may be arranged on the substrate 1 and may connect with and transmit the electrical power for the bare light-emitting chips 2. Each bare light emitting chip 2 has a light-emitting face 21 facing away from the supporting surface 11 of the substrate 1, receives the electrical power to emit light by the light-emitting face 21, and is a bare LED chip preferably. The transparent light guide 3 has a light-outputting layer 31 on a side of the transparent light guide 3 facing away from the supporting surface 11 of the substrate 1, so that the light emitted by the light-emitting face 21 goes out of the transparent light guide 3 through the light-outputting layer 31. Particularly, the transparent light guide 3 is made of transparent insulating material such as silica gel or epoxy resin.

In detail, the light-outputting layer 31 of the transparent light guide 3 has a light gathering member 311 to gather the light emitted by the light-emitting face 21. The light gathering member 311 is preferably in a form of plural ridges, and is more preferably constructed by several ring ridges with various radiuses as shown in FIG. 2. Furthermore, an included angle θ of a tip "a" of each ridge is in a range between a first angle and a second angle, with the first angle being twice a sum of a critical angle and 20 degrees and the second angle being twice a difference of the critical angle and 20 degrees. The critical angle is in the transparent light guide 3 for boundary between the transparent light guide 3 and the air. Preferably, the included angle θ is twice the critical angle. Accordingly, with the light gathering member 311, the total reflection of the light transmitting from the light-outputting layer 31 to the outer air can be avoided. For example, the included angle θ of the tip "a" of the light gathering member 311 is in a range between 60 and 100 degrees, with the included angle θ being 90 degrees while the refractive index of the transparent light guide 3 is 1.42, and with the included angle θ being 78 degrees while the refractive index of the transparent light guide 3 is 1.5. Besides, a maximum height "H" of the transparent light guide 3 is equal to or smaller than 20 times of a height "d" of any one of the bare light-emitting chips 2, so that the light-outputting layer 31 can be kept in the form of a thin film.

With the above arrangement, the volume of the transparent light guide 3 is limited since the light-outputting layer 31 in the form of a thin film is provided above the light-emitting faces 21 of the bare light-emitting chips 2 instead of a semi-spherical surface, and the light-outputting layer 31 with the light gathering member 311 can still provide a good illuminous efficiency in a desired direction substantially perpendicular to the substrate 1 even if the semi-spherical surface is absent. Please note that, owing to the absence of the semi-spherical surface, the volume of the transparent light guide 3 will not increase too much when the total of the bare light-emitting chips 2 increases. As a result, with the said transparent light guide 3, not only the heat dissipation efficiency is high, but also the manufacture cost is low.

Figure 4:
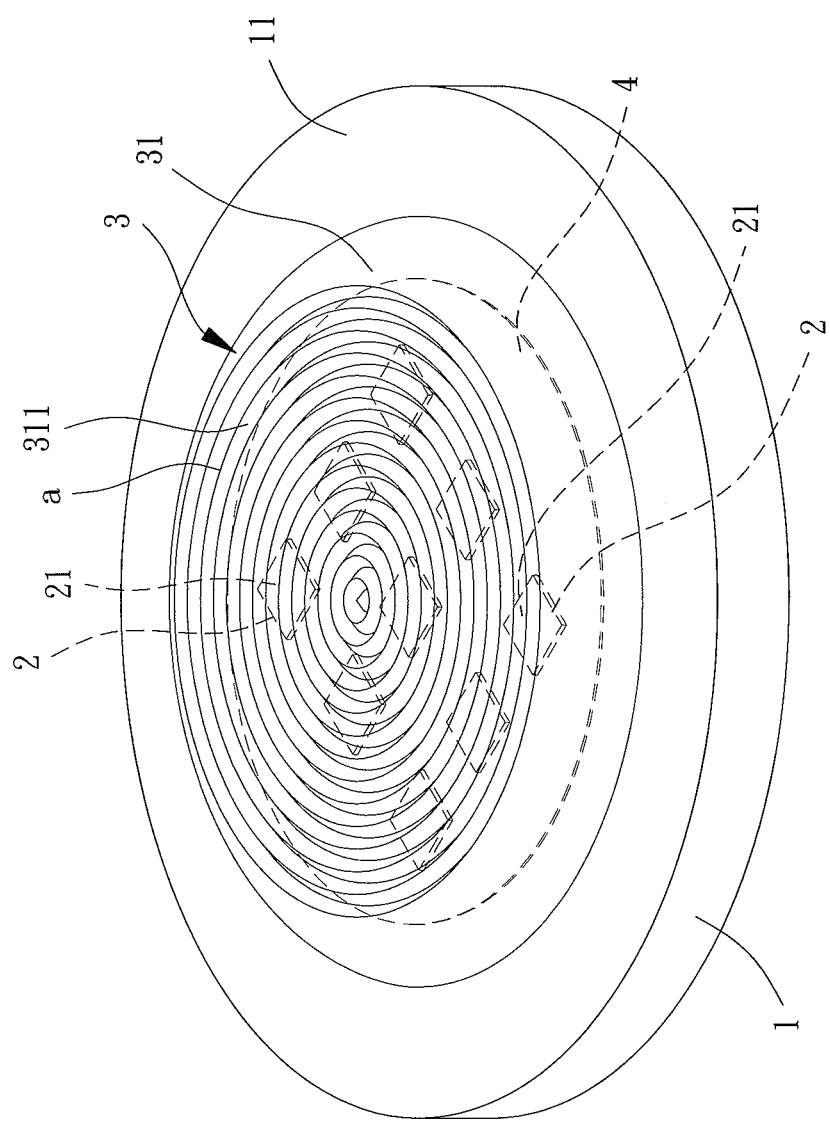
FIG. 4 shows a perspective view of a packaging structure for plural bare chips according to a second embodiment of the invention.
Figure 5:
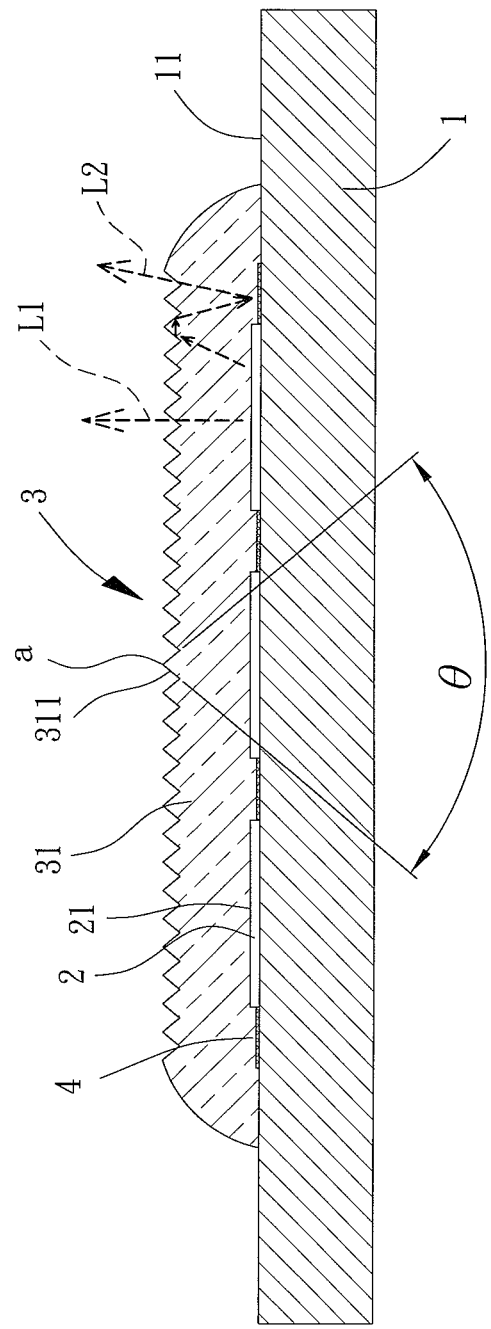
FIG. 5 shows a cross-sectional view of a packaging structure for plural bare chips according to the second embodiment of the invention.

Referring to FIGS. 4 and 5, a second embodiment of a packaging structure for plural bare chips of the present invention is shown. In comparison with the packaging structure of the first embodiment, the packaging structure in this embodiment not only includes the substrate 1, the bare light-emitting chips 2, and the transparent light guide 3, but further has a reflective layer 4. The substrate 1 supports the bare light-emitting chips 2, transparent light guide 3 and reflective layer 4, the transparent light guide 3 covers and seals the bare light-emitting chips 2 and reflective layer 4, and the reflective layer 4 is adapted to reflect light to enhance the illuminous efficiency in the desired direction. In detail, the reflective layer 4 is arranged on the supporting surface 11 and adjacent to the bare light-emitting chips 2, which preferably surrounds each of the bare light-emitting chips 2, to reflect light that could be absorbed by the substrate 1 towards the light-outputting layer 31.

Please refer to FIG. 5 again. The light emitted by the light-emitting face 21 can go out of the transparent light guide 3 through the light gathering member 311 directly as a line "L1" shown in FIG. 5. Alternatively, with the structure of the above second embodiment of the present invention, even if a minority of the emitted light may go back towards the supporting surface 11 due to the total internal reflection for the boundary between the transparent light guide 3 and the air, the reflective layer 4 can reflect the light back to the light gathering member 311 again as a line "L2" shown in FIG. 5. Therefore, the amount of light absorbed by the supporting surface 11 of the substrate 1 can be further reduced, and the probability of a ray of emitted light going out of the transparent light guide 3 in the desired direction is raised so that the illuminous efficiency of the present invention is enhanced.

Figure 6:
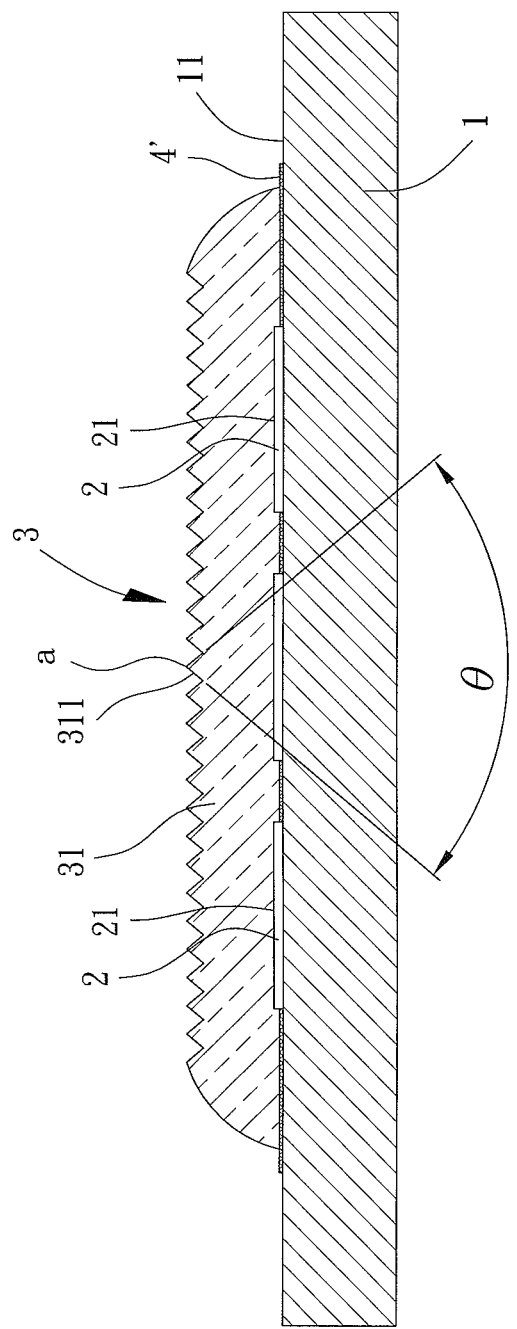
FIG. 6 shows a cross-sectional view of a packaging structure for plural bare chips according to the third embodiment of the invention.

Referring to FIG. 6, a third embodiment of a packaging structure for plural bare chips of the present invention is shown, which includes the substrate 1, the bare light-emitting chips 2, the transparent light guide 3 and a reflective layer 4'. In comparison with the previous reflective layer 4 of the second embodiment, the reflective layer 4' of this embodiment extends and protrudes out of the transparent light guide 3 along the supporting surface 11, with the transparent light guide 3 covering and sealing up the bare light emitting chips 2 and coupling with the reflective layer 4' instead of coupling with the substrate 1. Accordingly, all the reflected rays of light towards the supporting surface 11 by the total internal reflection can be reflected by the reflective layer 4' to substantially go in the desired direction, so that the illuminous efficiency of the present invention can be further enhanced.

Figure 7:
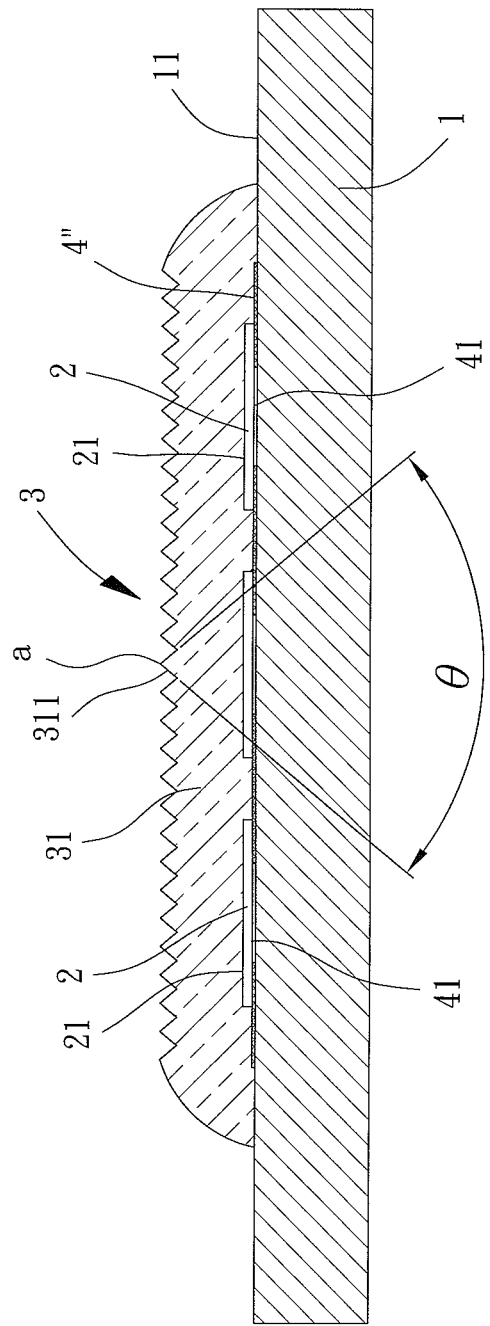
FIG. 7 shows a cross-sectional view of a packaging structure for plural bare chips according to the fourth embodiment of the invention.

Referring to FIG. 7, a fourth embodiment of a packaging structure for plural bare chips of the present invention is shown, which includes the substrate 1, the bare light-emitting chips 2, the transparent light guide 3 and a reflective layer 4". In comparison with the structure of the second embodiment, the major difference lies in that each bare light-emitting chip 2 is arranged on the reflective layer 4", and the reflective layer 4" has a plurality of through holes 41 corresponding to positions of the bare light-emitting chips 2 for control wires connecting with the bare light-emitting chips 2 to go through. Thereby, the reflective layer 4", bare light-emitting chips 2, and transparent light guide 3 can be sequentially formed above the substrate 1 to reduce the process complicity in manufacture.

In sum, by providing the light-outputting layer 31 with the light gathering member 311 and further disposing the reflective layer 4, 4' or 4" inside or beneath the transparent light guide 3, the present invention of packaging structure for plural bare chips can achieve high illuminous efficiency as well as low manufacture cost and high heat-dissipating efficiency.

Although the invention has been described in detail with reference to its presently preferable embodiments, it will be understood by one of ordinary skill in the art that various modifications can be made without departing from the spirit and the scope of the invention, as set forth in the appended claims.

What is claimed is:

1. A packaging structure for plural bare chips, comprising:
a substrate having a supporting surface;
a reflective layer arranged on the supporting surface and having a plurality of through holes;
a plurality of bare light-emitting chips arranged on the reflective layer and corresponding to the through holes; and
a transparent light guide covering the bare light-emitting chips and the reflective layer, with the transparent light guide having a light-outputting layer on a side of the transparent light guide facing away from the supporting surface, with the light-outputting layer parallel to the supporting surface and having a light gathering member, with the light gathering member being in a form of plural ridges, wherein an included angle of a tip of each ridge is in a range between a first angle and a second angle, with the first angle being twice a sum of a critical angle and 20 degrees, and with the second angle being twice a difference of the critical angle and 20 degrees, wherein the critical angle is in the transparent light guide for a boundary between the transparent light guide and air.

2. The packaging structure for plural bare chips as claimed in claim 1, wherein the included angle is 90 degrees while the refractive index of the transparent light guide is 1.42.

3. The packaging structure for plural bare chips as claimed in claim 1, wherein the included angle is 78 degrees while the refractive index of the transparent light guide is 1.5.

4. The packaging structure for plural bare chips as claimed in claim 1 wherein each ridge has a cross section of an isosceles triangle having a base parallel to the supporting surface.

5. The packaging structure for plural bare chips as claimed in claim 4, wherein the plural ridges are concentric and annular.

6. The packaging structure for plural bare chips as claimed in claim 4, wherein the transparent light guide covers the reflective layer totally and couples with the supporting surface of the substrate.

7. The packaging structure for plural bare chips as claimed in claim 4, wherein the transparent light guide covers the reflective layer partially, with the reflective layer extending and protruding out of the transparent light guide along the supporting surface.

8. The packaging structure for plural bare chips as claimed in claim 4, wherein a maximum height of the plural ridges of the transparent light guide is equal to or smaller than 20 times of a height of any one of the bare light-emitting chips.

9. A packaging structure for plural bare chips, comprising:
a substrate having a supporting surface;
a plurality of bare light-emitting chips supported by the supporting surface; and
a transparent light guide covering the bare light-emitting chips, with the transparent light guide having a light-outputting layer on a side of the transparent light guide facing away from the supporting surface, and with the light-outputting layer parallel to the supporting surface and having a light gathering member, wherein the light gathering member is in a form of plural ridges, and an included angle of a tip of each ridge is in a range between a first angle and a second angle, with the first angle being twice a sum of a critical angle and 20 degrees, with the second angle being twice a difference of the critical angle and 20 degrees, wherein the critical angle is in the transparent light guide for a boundary between the transparent light guide and air.

10. The packaging structure for plural bare chips as claimed in claim 9, wherein the included angle of the tip of each ridge is twice the critical angle.

11. The packaging structure for plural bare chips as claimed in claim 9, wherein the included angle is 90 degrees while the refractive index of the transparent light guide is 1.42.

12. The packaging structure for plural bare chips as claimed in claim 9, wherein the included angle is 78 degrees while the refractive index of the transparent light guide is 1.5.

13. The packaging structure for plural bare chips as claimed in claim 9, wherein each ridge has a cross section of an isosceles triangle having a base parallel to the supporting surface.

14. The packaging structure for plural bare chips as claimed in claim 9, wherein a reflective layer arranged on the supporting surface is adjacent to the bare light-emitting chips; and wherein the transparent light guide covers the reflective layer.

15. The packaging structure for plural bare chips as claimed in claim 14, wherein the transparent light guide covers the reflective layer totally and couples with the supporting surface of the substrate.

16. The packaging structure for plural bare chips as claimed in claim 14, wherein the transparent light guide covers the reflective layer partially, with the reflective layer extending and protruding out of the transparent light guide along the supporting surface.

17. The packaging structure for plural bare chips as claimed in claim 14, wherein a maximum height of the plural ridges of the transparent light guide is equal to or smaller than 20 times of a height of any one of the bare light-emitting chips.

18. The packaging structure for plural bare chips as claimed in claim 13, wherein a maximum height of the plural ridges of the transparent light guide is equal to or smaller than 20 times of a height of any one of the bare light-emitting chips.

19. The packaging structure for plural bare chips as claimed in claim 13, wherein the plural ridges are concentric and annular.

* * * * *